United States Patent
Chen

(10) Patent No.: US 11,340,735 B2
(45) Date of Patent: May 24, 2022

(54) FLOATING TOUCH DISPLAY DEVICE AND FLOATING TOUCH METHOD

(71) Applicant: WUHAN CHINA STAR OPTOELECTRONICS SEMICONDUCTOR DISPLAY TECHNOLOGY CO., LTD., Hubei (CN)

(72) Inventor: Bi Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 433 days.

(21) Appl. No.: 16/471,416

(22) PCT Filed: Feb. 21, 2019

(86) PCT No.: PCT/CN2019/075644
§ 371 (c)(1),
(2) Date: Jun. 19, 2019

(87) PCT Pub. No.: WO2020/124777
PCT Pub. Date: Jun. 25, 2020

(65) Prior Publication Data
US 2021/0357071 A1 Nov. 18, 2021

(30) Foreign Application Priority Data
Dec. 21, 2018 (CN) .......................... 201811575342.0

(51) Int. Cl.
*G06F 3/042* (2006.01)
*G06F 3/041* (2006.01)
(Continued)

(52) U.S. Cl.
CPC .......... *G06F 3/0421* (2013.01); *G06F 3/0416* (2013.01); *G06F 3/0428* (2013.01); *H01L 27/323* (2013.01); *G06F 2203/04108* (2013.01)

(58) Field of Classification Search
USPC ......................................................... 345/175
See application file for complete search history.

(56) References Cited

U.S. PATENT DOCUMENTS 4,254,333 A * 3/1981 Bergstrom ............ G06F 3/0421
250/221
9,423,830 B1 * 8/2016 Wei .................. B29D 11/00663
(Continued)

FOREIGN PATENT DOCUMENTS

| CN | 102455849 A | 5/2012 |
| CN | 103558949 A | 2/2014 |

(Continued)

*Primary Examiner* — Chineyere D Wills-Burns

(57) ABSTRACT

A floating touch display device and a floating touch method are provided. The floating touch display device includes a display layer, a protective cover, light emitting units, and light receiving units; the protective cover includes a first region and a second region surrounding the first region; the display layer is disposed under the first region; the light emitting units and the light receiving units are sequentially arranged under the second region. Each of the light emitting units corresponds to one light receiving unit. The floating touch is realized, by a light emitting unit transmitting an optical signal toward a direction above the protective cover and a corresponding light receiving unit of the light emitting unit that receives the optical signal reflected by a touch object above the protective cover. Such a design can extend a touch range of the floating touch and improve user experience.

7 Claims, 4 Drawing Sheets

(51) Int. Cl.
    *H01L 27/32* (2006.01)
    *G06F 3/044* (2006.01)

(56) References Cited

U.S. PATENT DOCUMENTS

| | | | |
|---|---|---|---|
| 2004/0212603 A1* | 10/2004 | Cok | H01L 27/14678 345/175 |
| 2004/0263482 A1* | 12/2004 | Goertz | G06F 3/0421 345/173 |
| 2005/0104860 A1* | 5/2005 | McCreary | G06F 3/0421 345/173 |
| 2006/0132454 A1* | 6/2006 | Chen | G06F 3/0421 345/173 |
| 2006/0161871 A1* | 7/2006 | Hotelling | G06F 3/0485 715/862 |
| 2006/0210761 A1 | 9/2006 | Barban | |
| 2008/0273019 A1* | 11/2008 | Deane | G06F 3/0421 385/14 |
| 2009/0002340 A1* | 1/2009 | Van Genechten | G06F 3/0425 345/175 |
| 2010/0039398 A1* | 2/2010 | Lin | G06F 3/044 345/173 |
| 2010/0066704 A1* | 3/2010 | Kasai | A63F 13/06 345/175 |
| 2010/0097348 A1* | 4/2010 | Park | G06F 3/0421 345/175 |
| 2011/0043490 A1* | 2/2011 | Powell | G06F 3/0421 345/176 |
| 2011/0122091 A1* | 5/2011 | King | G06F 3/0421 345/175 |
| 2012/0223916 A1* | 9/2012 | Kukulj | G06F 3/0428 178/18.09 |
| 2015/0053850 A1* | 2/2015 | Uvnas | G06F 3/0421 250/227.14 |
| 2015/0131010 A1* | 5/2015 | Sugiyama | G06F 3/0428 349/12 |
| 2016/0095173 A1* | 3/2016 | Diorio | H05B 45/50 315/130 |
| 2016/0216844 A1* | 7/2016 | Bergström | G02B 6/0015 |
| 2017/0115823 A1* | 4/2017 | Huang | G06F 3/0421 |
| 2017/0277323 A1* | 9/2017 | Kim | G06F 3/0446 |
| 2017/0285812 A1 | 10/2017 | Xu | |

FOREIGN PATENT DOCUMENTS

| | | |
|---|---|---|
| CN | 105912155 A | 8/2016 |
| CN | 106324848 A | 1/2017 |
| CN | 107329620 A | 11/2017 |

* cited by examiner

FLOATING TOUCH DISPLAY DEVICE AND FLOATING TOUCH METHOD

FIELD OF INVENTION

The present invention relates to the field of display technology, and in particular, to a floating touch display device and a floating touch method.

BACKGROUND OF INVENTION

Flat panel displays have many advantages, such as thin thickness, power saving, no radiation, and the like, thereby they have been widely used. Existing flat display devices are mainly classified into liquid crystal display devices and organic light emitting diode (OLED) display devices. The organic light emitting diode display devices have advantages of self-luminescence, requiring no backlights, high contrast, thin thickness, wide viewing angles, fast response times, flexible panels, wide temperature ranges, simple structures, and simple manufacturing processes, and the like. They are considered an emerging application technology for next-generation flat panel displays.

OLED display devices generally includes a substrate, an anode disposed on the substrate, an organic light-emitting layer disposed on the anode, an electron transport layer disposed on the organic light-emitting layer, and a cathode disposed on the electron transport layer. When the OLED works, electrons from holes of an anode, and a cathode are emitted to an organic light-emitting layer, the electrons and the holes are reacted to produce an excited electron-hole pair, and the excited electron-hole pair is converted from an excited state to a ground state to achieve luminescence.

Touch devices become the main human-computer interaction means for personal communication devices and integrated information terminals, such as tablet computers, smartphones, and notebooks, due to their advantages of easy use, intuitiveness, and flexibility. The touch device can be classified into four main types of a resistive touch device, a capacitive touch device, an infrared touch device, and a surface acoustic wave touch device according to different touch sensing principles. Floating touch is a new touch sensing manner, which can complete human-computer interaction without actually touching a panel of a mobile phone, providing a more convenient human-computer interaction mode.

Technical Problem

In prior art, implementation of the floating touch is generally achieved by combining a mutual capacitance sensing method and a self-capacitance sensing method in a touch screen. A coordinate output of an actual touch is realized by the mutual capacitance sensing method, and a coordinate output of a floating touch is realized by the self-capacitance sensing method. However, in the self-capacitance touch method, an electric field strength gradually decreases with an increase of the floating distance, a detection distance is generally within 20 mm. Beyond the detection distance, the touch object cannot be detected by a self-capacitance sensor, thereby resulting in a bad user experience. In addition, the floating touch by an insulator material cannot be achieved in the method.

Technical Solution

An object of the present invention is to provide a floating touch display device capable of expanding a touch range of the floating touch and improving a user experience.

The object of the present invention is to provide a floating touch method, which can expand a touch range of the floating touch device and improve a user experience of the floating touch device.

To achieve the above objectives, the present invention provides a floating touch display device including a display layer, a protective cover, a plurality of light emitting units, and a plurality of light receiving units; wherein the protective cover includes a first region and a second region surrounding the first region; wherein the display layer is disposed under the first region, the plurality of light emitting units and the plurality of light receiving units are disposed under the second region and sequentially arranged around the display layer, and wherein each of the light emitting units corresponds to one light receiving unit to form a sensing group, the light emitting unit and the light receiving unit in the same sensing group are respectively disposed on opposite sides of the display layer, the light emitting unit is configured to emit an optical signal toward a direction above the protective cover, and the light receiving unit is configured to receive a reflected optical signal generated by its corresponding light emitting unit and reflected by a touch object above the protective cover.

The second region includes a first side region, a second side region spaced from the first side region, a third side region adjacent to the first side region and a fourth side region spaced from the third side region, wherein the plurality of light emitting units are sequentially disposed under the first side region and the third side region, and the plurality of light receiving units are sequentially disposed under the second side region and the fourth side region, and wherein each of the light emitting units disposed under the first side region corresponds to one light receiving unit disposed under the second side region, and each of the light emitting units disposed under the third side region corresponds to one light receiving unit disposed under the fourth side region.

The floating touch display device further includes a touch-sensing layer located between the display layer and the protective cover and an ink frame disposed on a lower surface of the second region of the protective cover, the ink frame includes an inner frame and an outer frame surrounding the inner frame, material of the inner frame is semi-transparent, and material of the outer frame is opaque.

The light emitting unit emits an optical signal in a direction inclined at a predetermined first angle approaching the display layer with respect to a horizontal plane, and the light receiving unit receives a reflected optical signal in a direction inclined at a predetermined second angle approaching the display layer with respect to a horizontal plane. The first angle and the second angle each range from 30° to 60°.

The invention provides a floating touch method, including the following steps:

Step S1, providing a floating touch display device, including a display layer, a protective cover, a plurality of light emitting units, and a plurality of light receiving units; the protective cover includes a first region and a second region surrounding the first region, wherein the display layer is disposed under the first region, and a plurality of light emitting units and a plurality of light receiving units are disposed under the second region and sequentially arranged around the display layer, wherein each of the light emitting units corresponds to one light receiving unit to form a sensing group, and the light emitting unit and the light receiving unit in the same sensing group are respectively disposed on opposite sides of the display layer;

Step S2, the light emitting unit emits an optical signal toward a direction above the protective cover;

Step S3, a touch object above the protective cover reflects the optical signal emitted by the light emitting unit to generate a reflected optical signal; and Step S4, the light receiving unit receives the reflected optical signal and determines the position of the touch object according to a position of the light receiving unit that receives the reflected optical signal.

The step S4 further determines the distance between the touch object and the protective cover according to a time that the optical signal emitted by the light emitting unit reaches the light receiving unit and being received by the light receiving unit.

The optical signal is pulsed light, and a pulse period of the optical signal emitted by one light emitting unit is different from a pulse period of the optical signal emitted by the other light emitting unit, each of the light receiving units receives only the reflected optical signal having a pulse period the same as that of the optical signal emitted by its corresponding light emitting unit.

The light emitting unit emits an optical signal in a direction inclined at a predetermined first angle approaching the display layer with respect to a horizontal plane, and the light receiving unit receives a reflected optical signal in a direction inclined at a predetermined second angle approaching the display layer with respect to a horizontal plane. The first angle and the second angle each range from 30° to 60°.

Beneficial Effect

The invention provides a floating touch display device. The floating touch display device includes a display layer, a protective cover, a plurality of light emitting units and a plurality of light receiving units; wherein the protective cover includes a first region and a second region surrounding the first region; wherein the display layer is disposed under the first region, the plurality of light emitting units and the plurality of light receiving units are disposed under the second region and sequentially arranged around the display layer, and wherein each of the light emitting units corresponds to one light receiving unit. The floating touch is realized, by a light emitting unit transmits an optical signal toward a direction above a protective cover and a corresponding light receiving unit of the light emitting unit receives the optical signal reflected by a touch object above the protective cover. Such a design can extend a touch range of the floating touch and improve a user experience.

DETAILED DESCRIPTION OF PREFERRED EMBODIMENTS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

Figure 1:
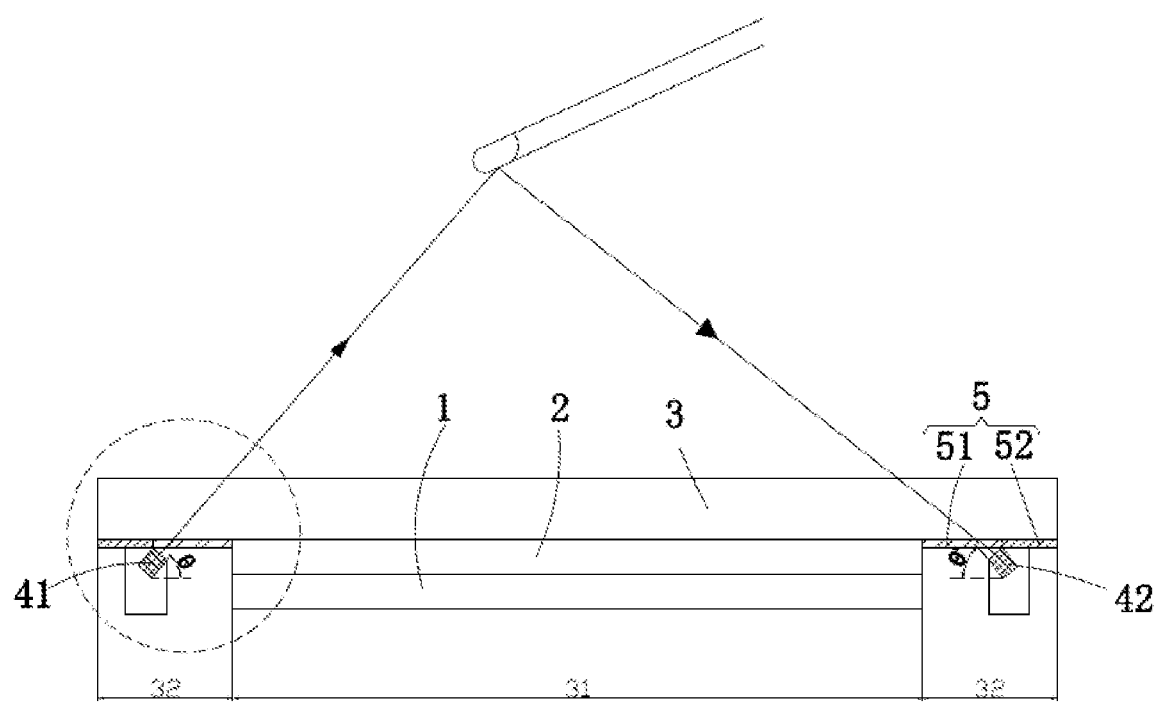
FIG. 1 is a side view of a floating touch display device of the present invention.
Figure 2:
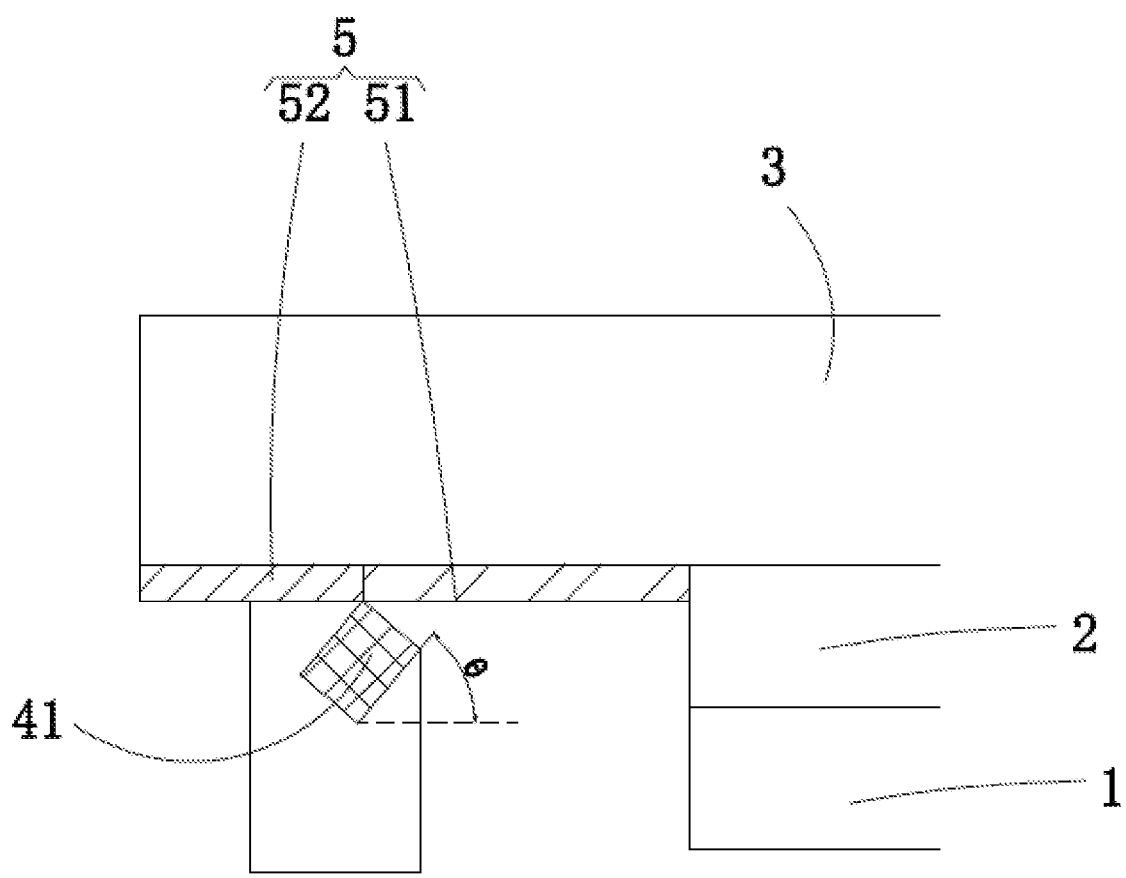
FIG. 2 is an enlarged view in a position of a circle dotted line in FIG. 1.
Figure 3:
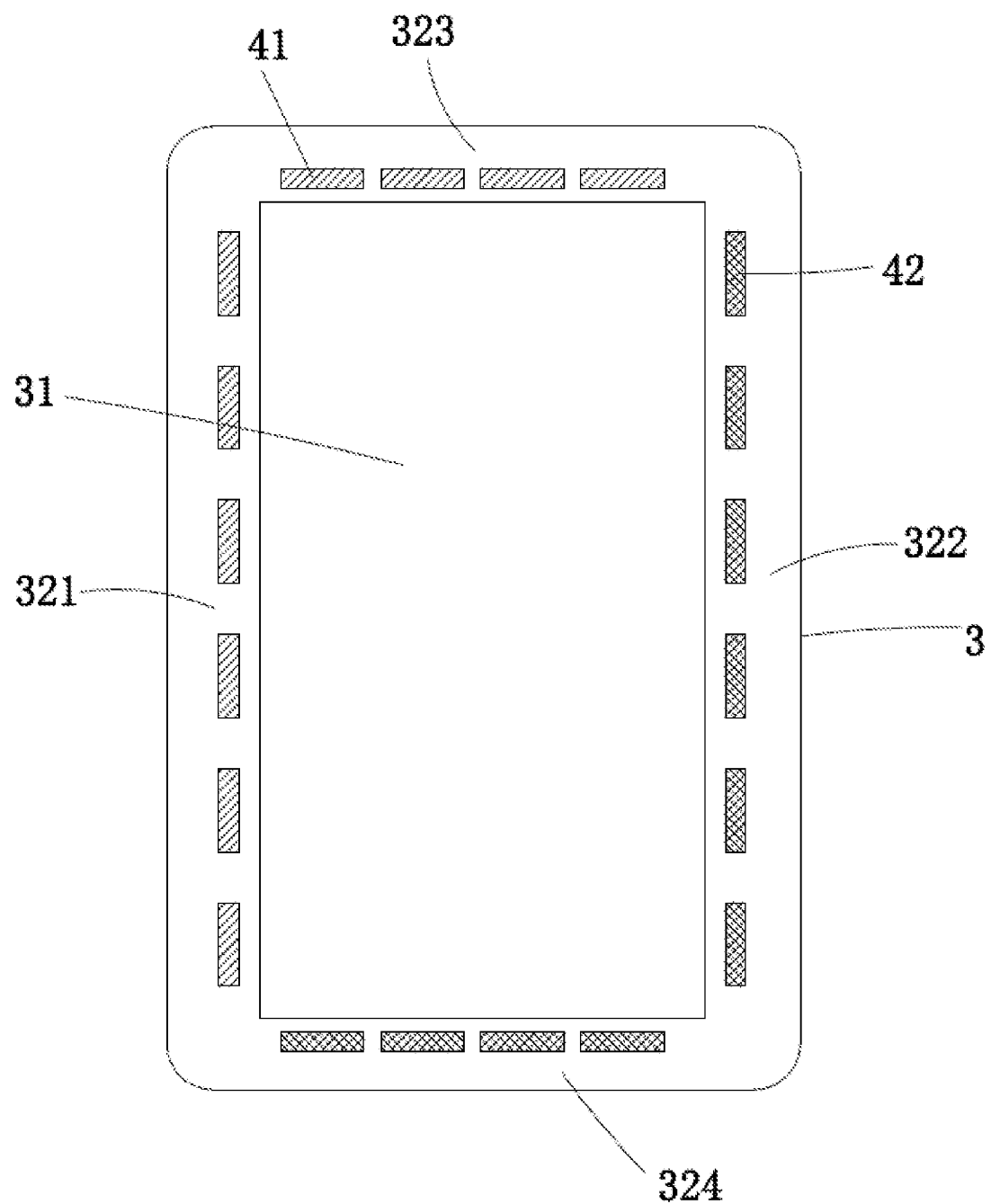
FIG. 3 is a top plan view of a floating touch display device of the present invention.

Please refer to FIG. 1 to FIG. 3, the present invention provides a floating touch display device including a display layer 1, a protective cover 3, a plurality of light emitting units 41, and a plurality of light receiving units 42; the protective cover 3 includes a first region 31 and a second region 32 surrounding the first region 31; the display layer 1 is disposed under the first region 31, the plurality of light emitting units 41 and the plurality of light receiving units 42 are disposed under the second region 32 and sequentially arranged around the display layer 1, and each of the light emitting units 41 corresponds to one light receiving unit 42 to form a sensing group, the light emitting unit 41 and the light receiving unit 42 in the same sensing group are respectively disposed on two opposite sides of the display layer 1, the light emitting unit 41 is configured to emit an optical signal toward a direction above the protective cover 3, and the light receiving unit 42 is configured to receive a reflected optical signal generated by its corresponding light emitting unit 41 and reflected by a touch object 100 above the protective cover 3.

Specifically, in some embodiments of the present invention, the protective cover 3 includes a first region 31 and a second region 32 surrounding the first region 31; the second region 32 includes a first side region 321, a second side region 322 spaced from the first side region 321, a third side region 323 adjacent to the first side region 321, and a fourth side region 324 spaced from the third side region 323.

Further, the display layer 1 is disposed under the first region 31, the plurality of light emitting units 41 are sequentially arranged under the first side region 321 and the third side region 323, and the plurality of light receiving units 42 are sequentially arranged under the second side region 322 and the fourth side region 324. Each of the light emitting units 41 located under the first side region 321 corresponds to a light receiving unit 42 located under the second side region 322, and each of the light emitting units 41 located under the third side region 323 corresponds to a light receiving unit 42 located under the fourth side region 324.

Preferably, the protective cover 3 is rectangular, the first region 31 is a rectangular region located at the center of the protective cover 3, and the second region 32 is a frame shape region surrounding the first region 31. The first side region 321, the second side region 322, the third side region 323, and the fourth side region 324 are respectively disposed on four sides of the protective cover 3.

Further, when performing a floating touch, a position of the touch object is determined according to a position of the light receiving unit that receives a reflected optical signal. Specifically, a position of the touch object 100 is determined according to a combination of a position of the light receiving unit 42 under the second side region 322 which receives a reflected optical signal and a position of the light receiving unit 42 under the fourth side region 324 which receives a reflected optical signal. At the same time, the floating touch device further determines the distance between the touch object 100 and the protective cover 3 according to a time that the optical signal emitted by the light emitting unit 41 reaches the light receiving unit 42 and being received by the light receiving unit.

Figure 4:
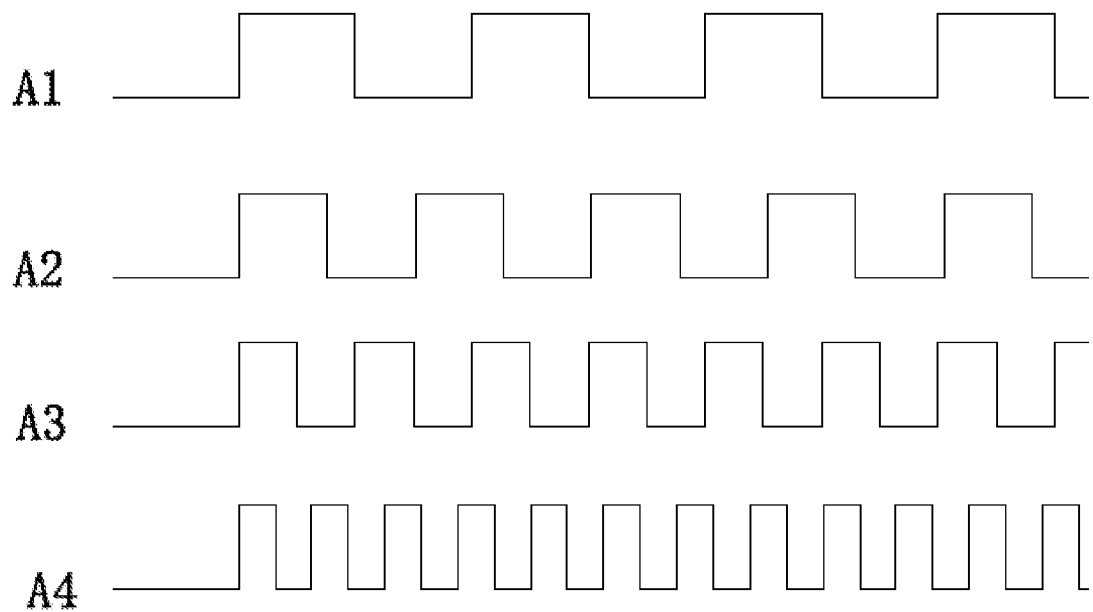
FIG. 4 is an oscillogram of the optical signals emitted by the floating touch display device of the present invention.

It should be noted that, as shown in FIG. 1 and FIG. 4, the detailed working process of the floating touch display device is as follows:

When a touch object 100 is floating above a touch display module, a light emitting unit 41 emits an optical signal having a specific wavelength, and the optical signal is modulated into a continuous pulse light wave or a sinusoidal light wave. In this embodiment, the pulse light wave is taken as an example. After an optical signal is transmitted to a touch object 100, the optical signal is diffusely reflected by the touch object 100 to generate a reflected optical signal, and a portion of the reflected optical signal is transmitted to and received by a light receiving unit 42. At this time, by calculating the time that the emitted optical signal reaches the light receiving unit 42 and is received by the light receiving unit 42, the distance between the touch object 100 and the protective cover 3 can be determined.

In the present invention, each of the light emitting units 41 disposed under the first side region 321 corresponds to a light receiving unit 42 disposed under the second side region 322, and each of the light emitting units 41 disposed under the third side region 323 corresponds to a light receiving unit 42 disposed under the fourth side region 324, thereby, the sensing of a row position can be performed by the light emitting unit 41 located under the first side region 321 and the light receiving unit 42 located under the second side region 322, and the sensing of a column position is performed by the light emitting unit 41 located under the third side region 323 and the light receiving unit 42 located under the fourth side region 324. A row coordinate of the touch object 100 is determined by a position of the light receiving unit which receives a reflected optical signal and located under the second side region, and a column coordinate of the touch object 100 is determined by a position of the light receiving unit which receives a reflected optical signal and located under the fourth side region. A position of the touch object 100 is determined by the column and row coordinates of the touch object 100. The column and row coordinates of the touch object 100 plus the distance between the touch object 100 and the protective cover 3, three-dimensional positioning of the touch object 100 can be realized.

It should be noted that utilization of a positional arrangement of the light emitting units 41 and the light receiving units 42 of the present invention, the determination of a row and column coordinates of the touch object 100 by the light emitting unit 41 and the light receiving unit 42 can be realized. In addition, identification of multi-points floating touch can be supported.

Further, the optical signal is pulsed light, and a pulse period of the optical signal emitted by one light emitting unit 41 is different from a pulse period of the optical signal emitted by the other light emitting unit 41, each of the light receiving units 42 receives only the reflected optical signal having a pulse period the same as that of the optical signal emitted by its corresponding light emitting unit 41.

As shown in FIG. 4, four light emitting units 41 located in the third side region 323 in FIG. 3 are taken as an example. The optical signals emitted by the four light emitting units 41 are A1, A2, A3, and A4, respectively. It can be seen in FIG. 4, A1, A2, A3, and A4 have different pulse periods, the corresponding four light receiving units 42 located in the fourth side region 324 each receives only the reflected optical signal having a pulse period the same as that of A1, A2, A3, and A4, respectively.

Specifically, the light emitting unit 41 emits an optical signal in a direction inclined at a predetermined first angle approaching the display layer 1 with respect to a horizontal plane, and the light receiving unit 42 receives a reflected optical signal in a direction inclined at a predetermined second angle approaching the display layer 1 with respect to a horizontal plane.

As shown in FIG. 2, the first angle is θ, the second angle is θ', the first angle and the second angle may be equal or unequal. The light emitting unit 41 and the light receiving unit 42 are both inclined in a direction close to a center of the protective cover 3. By adjusting the angles of the light emitting unit 41 and the light receiving unit 42 with respect to the horizontal plane, tuning an effective floating touch height that the floating touch device can recognize is enabled.

Preferably, the first angle and the second angle each range from 30° to 60° to maximize the floating touch height.

In order to prevent an optical signal emitted by a light emitting unit 41 from interfering with the display of a floating touch display device, the optical signal emitted by the light emitting unit 41 is set to be invisible light. Preferably, the optical signal emitted by the light emitting unit 41 is infrared light or ultraviolet light. Since the present invention performs the recognition of floating touch by emitting an optical signal, a touch object 100 of the present invention does not need to be electrically conductive. Therefore, the touch object 100 can be a conductor or an insulator, and the touch range is wider. Generally, the touch object 100 is a finger.

Further, in order to improve the aesthetic appearance of the front surface of a floating touch display device, the floating touch display device of the present invention further includes an ink frame 5 disposed on a lower surface of the second region 32 of the protective cover 3, the ink frame 5 includes an inner frame 51 and an outer frame 52 surrounding the inner frame 51, material of the inner frame 51 is semi-transparent, and material of the outer frame 52 is opaque. By providing a semi-transparent inner frame 51, in the case of an optical signal can be transmitted and a reflected optical signal can be received, it is also ensured that a user does not easily perceive the light emitting unit 41 and the light receiving unit 42 under the front surface of the floating touch display device.

It should be noted that the semi-transparent material is defined as a material capable of blocking part of visible light and allowing penetration of invisible light, such as ultraviolet light or infrared light.

Specifically, the floating touch display device further includes a touch-sensing layer 2 located between the display layer 1 and the protective cover 3. The touch-sensing layer 2 can be a self-capacitance type or a mutual capacitance type structure, which is used for performing touch sensing when a user's finger directly contacts the floating touch display device. The structure of touch-sensing layer 2 generally includes an electrode substrate and a touch electrode disposed on the electrode substrate. The electrode substrate may be a glass or a polyethylene terephthalate (PET) plastic material. Of course, the touch electrode can be directly formed on the display layer 1 without providing an electrode substrate, such that the floating touch display device of the present invention can simultaneously implement multi-points floating type touch and multi-points contact type touch.

Specifically, the display layer 1 is an organic light emitting diode (OLED) display layer.

The invention also provides a floating touch method, including the following steps:

Step S1, providing a floating touch display device, including a display layer 1, a protective cover 3, a plurality of light emitting units 41, and a plurality of light receiving units 42; the protective cover 3 includes a first region 31 and a second region 32 surrounding the first region 31, wherein the display layer 1 is disposed under the first region 31, and a plurality of light emitting units 41 and a plurality of light receiving units 42 are disposed under the second region 32 and sequentially arranged around the display layer 1, wherein each of the light emitting units 41 corresponds to one light receiving unit 42 to form a sensing group, and the light emitting unit 41 and the light receiving unit 42 in the same sensing group are respectively disposed on opposite sides of the display layer 1. Specifically, in an embodiment of the invention, the protective cover 3 includes a first region 31 and a second region 32 surrounding the first region 31, the second region 32 includes a first side region 321, a second side region 322 spaced from the first side region 321, a third side region 323 adjacent to the first side region 321, and a fourth side region 324 spaced from the third side region 323. Further, the display layer 1 is disposed under the first region 31, the plurality of light emitting units 41 are sequentially arranged under the first side region 321 and the third side region 323, and the plurality of light receiving unit 42 are sequentially arranged under the second side region 322 and the fourth side region 324. Each of the light emitting units 41 located under the first side region 321 corresponds to a light receiving unit 42 located under the second side region 322. Each of the light emitting units 41 located under the third side region 323 corresponds to a light receiving unit 42 located under the fourth side region 324. Preferably, the protective cover 3 is rectangular, the first region 31 is a rectangular region located at the center of the protective cover 3, and the second region 32 is a frame shape region surrounding the first region 31. The first side region 321, the second side region 322, the third side region 323, and the fourth side region 324 are respectively disposed corresponding to the four sides of the protective cover 3.

Step S2, a light emitting unit 41 emits an optical signal toward a direction above a protective cover 3.

Step S3, a touch object 100 above the protective cover 3 reflects the optical signal emitted by the light emitting unit 41 to generate a reflected optical signal.

Step S4, a light receiving unit 42 receives the reflected optical signal and determines a position of the touch object 100 according to the position of the light receiving unit 42 that receives the reflected light signal.

Further, in the step S4, a position of the touch object 100 is determined according to a combination of a position of the light receiving unit 42 under the second side region 322 which receives a reflected optical signal and a position of the light receiving unit 42 under the fourth side region 324 which receives a reflected optical signal. At the same time, the floating touch device further determines the distance between the touch object 100 and the protective cover 3 according to the time that the optical signal emitted by the light emitting unit 41 reaches the light receiving unit 42 and being received by the light receiving unit.

It should be noted that the steps S2 to S4 include the detailed process as follows:

When a touch object 100 is floating above a touch display module, a light emitting unit 41 emits an optical signal having a specific wavelength, and the optical signal is modulated into a continuous pulse light wave or a sinusoidal light wave. In this embodiment, the pulse light wave is taken as an example.

After an optical signal is transmitted to a touch object 100, the optical signal is diffusely reflected by the touch object 100 to generate a reflected optical signal, and a portion of the reflected optical signal is transmitted to and received by a light receiving unit 42. At this time, by calculating the time that the emitted optical signal reaches the light receiving unit 42 and is received by the light receiving unit 42, the distance between the touch object 100 and the protective cover 3 can be determined.

In the present invention, each of the light emitting units 41 located under the first side region 321 corresponds to a light receiving unit 42 located under the second side region 322, and each of the light emitting units 41 located under the third side region 323 corresponds to a light receiving unit 42 located under the fourth side region 324, thereby, the sensing of the row position can be performed by the light emitting unit 41 located under the first side region 321 and the light receiving unit 42 located under the second side region 322, and the sensing of the column position can be performed by the light emitting unit 41 located under the third side region 323 and the light receiving unit 42 located under the fourth side region 324.

A row coordinate of the touch object 100 is determined by a position of the light receiving unit which receives a reflected optical signal and located under the second side region, and a column coordinate of the touch object 100 is determined by a position of the light receiving unit which receives a reflected optical signal and located under the fourth side region. The position of the touch object 100 is determined by the column and the row coordinates of the touch object 100. The column and the row coordinates of the touch object 100 plus the distance between the touch object 100 and the protective cover 3, three-dimensional positioning of the touch object 100 can be realized.

It should be noted that utilization of a positional arrangement of the light emitting units 41 and the light receiving units 42 of the present invention, the determination of a row and column coordinates of the touch object 100 by the light emitting unit 41 and the light receiving unit 42 can be realized. In addition, identification of multi-points floating touch can be supported.

Further, the optical signal is pulsed light, and a pulse period of the optical signal emitted by one light emitting unit 41 is different from a pulse period of the optical signal emitted by the other light emitting unit 41, each of the light receiving units 42 receives only the reflected optical signal having a pulse period the same as that of the optical signal emitted by its corresponding light emitting unit 41.

As shown in FIG. 4, four light emitting units 41 located in the third side region 323 in FIG. 3 are taken as an example. The optical signals emitted by the four light emitting units 41 are A1, A2, A3, and A4, respectively. It can be seen in FIG. 4, A1, A2, A3, and A4 have different pulse periods, the corresponding four light receiving units 42 located in the fourth side region 324 each receives only the reflected optical signal having a pulse period the same as that of A1, A2, A3, and A4, respectively.

Specifically, the light emitting unit 41 emits an optical signal in a direction inclined at a predetermined first angle approaching the display layer 1 with respect to a horizontal plane, and the light receiving unit 42 receives a reflected optical signal in a direction inclined at a predetermined second angle approaching the display layer 1 with respect to a horizontal plane.

As shown in FIG. 2, the first angle is θ, the second angle is θ', the first angle and the second angle may be equal or unequal. The light emitting unit 41 and the light receiving unit 42 are both inclined in a direction close to a center of the protective cover 3. By adjusting the angles of the light emitting unit 41 and the light receiving unit 42 with respect to the horizontal plane, tuning an effective floating touch height that the floating touch device can recognize is enabled.

Preferably, the first angle and the second angle each range from 30° to 60° to maximize the floating touch height.

In order to prevent an optical signal emitted by a light emitting unit 41 from interfering with the display of a floating touch display device, the optical signal emitted by the light emitting unit 41 is set to be invisible light. Preferably, the optical signal emitted by the light emitting unit 41 is infrared light or ultraviolet light. Since the present invention performs the recognition of floating touch by emitting an optical signal, a touch object 100 of the present invention does not need to be electrically conductive. Therefore, the touch object 100 can be a conductor or an insulator, and the touch range is wider. Generally, the touch object 100 is a finger.

Further, in order to improve the aesthetic appearance of the front surface of the floating touch display device, the floating touch display device of the present invention further includes an ink frame 5 disposed on a lower surface of the second region 32 of the protective cover 3, the ink frame 5 includes an inner frame 51 and an outer frame 52 surrounding the inner frame 51, material of the inner frame 51 is semi-transparent, and material of the outer frame 52 is opaque. By providing a semi-transparent inner frame 51, in the case of an optical signal can be transmitted and a reflected optical signal can be received, it is also ensured that a user does not easily perceive the light emitting unit 41 and the light receiving unit 42 under the front surface of the floating touch display device.

It should be noted that the semi-transparent material is defined as a material capable of blocking part of visible light and allowing penetration of invisible light, such as ultraviolet light or infrared light.

Specifically, the floating touch display device further includes a touch-sensing layer 2 located between the display layer 1 and the protective cover 3. The touch-sensing layer 2 can be a self-capacitance type or a mutual capacitance type structure, which is used for performing touch sensing when a user's finger directly contacts the floating touch display device. The structure of touch-sensing layer 2 generally includes an electrode substrate and a touch electrode disposed on the electrode substrate. The electrode substrate may be a glass or a polyethylene terephthalate (PET) plastic material. Of course, the touch electrode can be directly formed on the display layer 1 without providing an electrode substrate so that the floating touch display device of the present invention can simultaneously implement multi-point floating type touch and multi-point contact type touch.

Specifically, the display layer 1 is an organic light emitting diode (OLED) display layer.

In summary, the invention provides a floating touch display device. The floating touch display device includes a display layer, a protective cover, a plurality of light emitting units, and a plurality of light receiving units; wherein the protective cover includes a first region and a second region surrounding the first region; wherein the display layer is disposed under the first region, the plurality of light emitting units and the plurality of light receiving units are disposed under the second region and sequentially arranged around the display layer, and wherein each of the light emitting units corresponds to one light receiving unit. The floating touch is realized, by a light emitting unit transmits an optical signal toward a direction above a protective cover and a corresponding light receiving unit of the light emitting unit receives the optical signal reflected by a touch object above the protective cover. Such a design can extend a touch range of the floating touch and improve a user experience.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. A floating touch display device, comprising:
a display layer, a protective cover, a plurality of light emitting units, and a plurality of light receiving units;
wherein the protective cover includes a first region and a second region surrounding the first region;
wherein the display layer is disposed under the first region, the plurality of light emitting units and the plurality of light receiving units are disposed under the second region and sequentially arranged around the display layer, and wherein each of the light emitting units corresponds to one light receiving unit to form a sensing group, the light emitting unit and the light receiving unit in the same sensing group are respectively disposed on opposite sides of the display layer, the light emitting unit is configured to emit an optical signal toward a direction above the protective cover, and the light receiving unit is configured to receive a reflected optical signal generated by its corresponding light emitting unit and reflected by a touch object above the protective cover;
wherein the light emitting unit emits an optical signal in a direction inclined at a predetermined first angle approaching the display layer with respect to a horizontal plane, and the light receiving unit receives a reflected optical signal in a direction inclined at a predetermined second angle approaching the display layer with respect to a horizontal plane; and
wherein the predetermined first angle and the predetermined second angle each range from 30° to 60°.

2. The floating touch display device of claim 1, wherein the second region comprises a first side region, a second side region spaced from the first side region, a third side region adjacent to the first side region and a fourth side region spaced from the third side region, wherein the plurality of light emitting units are sequentially disposed under the first side region and the third side region, and the plurality of light receiving units are sequentially disposed under the second side region and the fourth side region, and wherein each of the light emitting units disposed under the first side region corresponds to one light receiving unit disposed under the second side region, and each of the light emitting units disposed under the third side region corresponds to one light receiving unit disposed under the fourth side region.

3. The floating touch display device of claim 1, wherein the floating touch display device further comprises a touch-sensing layer located between the display layer and the protective cover and an ink frame disposed on a lower surface of the second region of the protective cover, the ink frame comprises an inner frame and an outer frame surrounding the inner frame, material of the inner frame is semi-transparent, and material of the outer frame is opaque.

4. A floating touch method, comprising the following steps:
Step S1, providing a floating touch display device, including a display layer, a protective cover, a plurality of light emitting units, and a plurality of light receiving units; the protective cover includes a first region and a second region surrounding the first region, wherein the display layer is disposed under the first region, and a plurality of light emitting units and a plurality of light receiving units are disposed under the second region and sequentially arranged around the display layer, wherein each of the light emitting units corresponds to one light receiving unit to form a sensing group, and the light emitting unit and the light receiving unit in the same sensing group are respectively disposed on opposite sides of the display layer;

Step S2, emitting, by the light emitting unit, an optical signal toward a direction above the protective cover;

Step S3, reflecting, by a touch object above the protective cover, the optical signal emitted by the light emitting unit to generate a reflected optical signal; and Step S4, receiving, by the light receiving unit, the reflected optical signal and determining the position of the touch object according to a position of the light receiving unit that receives the reflected optical signal;

wherein the optical signal is pulsed light, and a pulse period of the optical signal emitted by one light emitting unit is different from a pulse period of the optical signal emitted by the other light emitting unit, each of the light receiving units receives only the reflected optical signal having a pulse period the same as that of the optical signal emitted by its corresponding light emitting unit.

5. The floating touch method of claim 4, wherein the step S4 further determines a distance between the touch object and the protective cover according to time that the optical signal emitted by the light emitting unit reaches the light receiving unit and being received by the light receiving unit.

6. The floating touch method of claim 4, wherein the light emitting unit emits an optical signal in a direction inclined at a predetermined first angle approaching the display layer with respect to a horizontal plane, and the light receiving unit receives a reflected optical signal in a direction inclined at a predetermined second angle approaching the display layer with respect to a horizontal plane.

7. The floating touch method of claim 6, wherein the first angle and the second angle each range from 30° to 60°.

* * * * *